United States Patent
Freidin et al.

[11] Patent Number: 5,961,576
[45] Date of Patent: *Oct. 5, 1999

[54] CONFIGURABLE PARALLEL AND BIT SERIAL LOAD APPARATUS

[75] Inventors: Philip M. Freidin, Sunnyvale; Stephen M. Trimberger; John E. Mahoney, both of San Jose; Charles R. Erickson, Fremont, all of Calif.

[73] Assignee: Xilinx, Inc., San Jose, Calif.

[*] Notice: This patent is subject to a terminal disclaimer.

[21] Appl. No.: 09/176,626

[22] Filed: Oct. 22, 1998

Related U.S. Application Data

[63] Continuation-in-part of application No. 08/985,392, Dec. 4, 1997, Pat. No. 5,844,829, which is a continuation of application No. 08/642,758, May 3, 1996, Pat. No. 5,742,531.

[51] Int. Cl.$^6$ ................................ G06F 1/04; G06F 7/38
[52] U.S. Cl. ............................................. 708/232; 710/71
[58] Field of Search .................................. 708/209, 230, 708/232, 234, 235, 236; 710/71; 326/9, 38, 39; 365/185.11, 185.22, 189.04, 230.08

[56] References Cited

U.S. PATENT DOCUMENTS

| | | | |
|---|---|---|---|
| 4,761,768 | 8/1988 | Turner et al. | 365/185.22 |
| 4,766,569 | 8/1988 | Turner et al. | 365/185.11 |
| 5,283,781 | 2/1994 | Budd et al. | 370/246 |
| 5,430,687 | 7/1995 | Hung et al. | 365/230.08 |
| 5,654,650 | 8/1997 | Gissel | 326/38 |
| 5,721,498 | 2/1998 | Mason | 326/38 |

*Primary Examiner*—Chuong Dinh Ngo
*Attorney, Agent, or Firm*—Anthony C. Murabito; Wagner, Murabito & Hao; Jeanette S. Harms

[57] ABSTRACT

An apparatus for loading configuration information into a programmable integrated circuit (e.g., an FPGA) configurable to perform parallel loading or bit serial loading within the same architecture. The configuration information is presented to the FPGA in data frames of N serial bits each. Each data frame is divided into discrete serial portions having Y bits each (e.g., a data frame comprises N/Y portions). In parallel mode, the portions are loaded into a segmented configuration register, one portion per programming cycle, such that Y bits are loaded into the segmented configuration register in parallel. On each programming clock cycle during parallel loading, all the bits of a data frame portion are simultaneously loaded into the segments of the configuration register (at the first bit position for each segment) such that each segment receives one bit per programming cycle. The bits of the configuration register are then shifted down by one and the cycle repeats for the next data frame portion. Under this mechanism, Y bits are loaded in parallel into the configuration register for increased transfer rate. The architecture of the novel configuration register is such that it is configurable in a serial mode to receive a single serial bit stream of the N bit data frame for downward compatibility.

4 Claims, 9 Drawing Sheets

CONFIGURABLE PARALLEL AND BIT SERIAL LOAD APPARATUS

RELATED APPLICATIONS

This application is a continuation-in-part application of U.S. patent application Ser. No. 08/985,392, filed on Dec. 4, 1997, now U.S. Pat. No. 5,844,829 which in turn is a continuation of Ser. No. 08/642,758, filed May 3, 1996, now U.S. Pat. No. 5,742,531, issued on Apr. 21, 1998.

BACKGROUND OF THE INVENTION

1. Field of the Invention

The present invention relates to the field of programmable integrated circuit devices, and specifically to loading configuration information into a field programmable gate array.

2. Background Technology

Programmable integrated circuits, such as field programmable gate arrays (FPGAs), are programmed to perform a particular task by loading configuration information into the FPGA. The configuration information can be viewed as strings of binary bits. The configuration information is loaded into the FPGA during programming cycles which are performed before the FPGA is used for its intended function. The configuration information is used to initialize the configurable logic circuits (CLCs) of the FPGA and also to program the programmable interconnect structures of the FPGA to provide the required connections between CLCs. The configuration information can be stored in a nonvolatile memory (e.g., ROM) and loaded into the FPGA upon device power-up, or, the configuration information can be permanently programmed (e.g., one-time only) into an FPGA having antifuse material. In either instance, the configuration information requires loading into the FPGA.

The configuration information is loaded into the FPGA in data frames ("frames"). The frame length indicates the number of bits for a specific embodiment. Note that this number varies from one embodiment to another. Consecutive frames are used to load the configuration information into a particular FPGA during initialization. During initialization in prior art designs, a frame of data is serially loaded into a configuration register of an FPGA using successive programming cycles. Once in the configuration register, the bits of the frame (e.g., a data word) are stored into locations of a memory unit using conventional memory access cycles which store the entire data word. These programming cycles repeat until all of the data frames are loaded into the FPGA. Typical programming frequencies can run 4 MHz or more.

FIG. 1A illustrates one prior art mechanism for loading configuration information within a prior art FPGA 100. Bits of configuration information data frames are serially loaded, bit by bit, over a serial input port 30 into a receiving shift register 15. The receiving shift register 15 is composed of N serially coupled one-bit shift registers, 15(1 to n), each clocked by the same clock signal. The receiving shift register 15 contains a one-bit shift register for each of the N bits of the frame of configuration information. As the configuration information is serially bit shifted into the serial input port 30, the bits of the receiving shift register 15 are bit shifted downstream in synchronization.

The first bit of each configuration data frame contains a frame start flag, thereby when the frame start flag reaches shift register 15(n), the last one-bit shift register, the data frame has been completely loaded into the receiving shift register 15. A data frame having N bits is completely loaded in N programming cycles using the mechanism of FIG. 1A.

There are N number of data lines 20(1 to n) and each shift register 15(1 to n) is coupled to an associated data line. Each data line 20(1 to n) is also coupled to a memory unit 10. During a write cycle, each bit stored in the receiving shift register 15 is simultaneously loaded as a data word into the memory unit 10 via data lines 20 (1 to n).

FIG. 1B illustrates another prior art mechanism for loading configuration information into an FPGA 100'. In this mechanism, the configuration register is comprised of a number of blocks (e.g., 35, 36, ..., and 37) and each block is comprised of eight 8-bit shift registers (a–h). With a data frame having N bits, there are N/8 blocks and N 8-bit shift registers required. Configuration information is loaded 8 bits per programming cycle over bus 32. Each of the 8-bit shift registers of a block receives a single configuration bit in a unique bit location for the block. For example, block register 35a receives its bit in position 1, 35b in position 2, 35c in position 3, etc., and block register 35h receives its bit in position 8.

The 8 bits within block 35 are simultaneously loaded into block 35 from bus 32 during a programming cycle. During each programming cycle (e.g., clock cycle), the previous bits of each block are loaded into its downstream block. For example, after block 35 receives the 8 bits, upon the next programming cycle, these bits are shifted into the downstream block 36. The other downstream blocks are analogously configured and operate according to block 35. Each 8-bit register in these blocks (e.g., 36, ..., 37) contains a corresponding bit position for receiving the shifted bits from their upstream neighbor. For instance, register 36a receives register 35a's bit in position 1, register 36b receives register 35b's bit in position 2, etc., and register 36h receives register 35h's bit in position 8. This staggered bit position approach is implemented so that the data lines 20(1 to n) are aligned parallel to each other. In the implementation of FIG. 1B, the input configuration data is not parallel loaded into consecutive positions of a single shift register.

Each 8-bit register (a–h) of each block (35 ... 37) of FIG. 1B is coupled to a data line (e.g., lines 20(1 to n)) so there is a separate data line for each of the N bits of a frame. When the receiving register blocks (35–37) are full, the data frame information is loaded into the memory unit 10 in accordance with the system of FIG. 1A.

It is appreciated that the mechanism of FIG. 1B can also be implemented where each block (e.g., 35 to 37) contains one horizontally positioned 8-bit register which receives all eight bits per programming cycle, however, this implementation requires staggering of the data lines 20(1 to n). It is desired not to stagger the data lines 20(1 to n) in order to facilitate layout and manufacturing of the resultant circuit.

The system of FIG. 1B provides an eight fold increase in configuration data transfer rate over the system of FIG. 1A since eight bits can be transferred through the blocks (35 ... 37) per programming cycle. However, since the architecture of the system of FIG. 1B does not store the configuration bits serially in a contiguous bit stream, it is not downward compatible with the system of FIG. 1A. Moreover, there is no straight forward circuit modification available for the system of FIG. 1B that would render the circuit downwardly compatible with the system of FIG. 1A without severely enlarging the circuit area.

Accordingly, what is needed is a configuration information transfer mechanism allowing parallel loading of configuration data bits so that high speed data transfer rates are obtained. The present invention provides this advantage. What is needed further is a high speed configuration information transfer mechanism that is downward compatible with a system employing the mechanism of FIG. 1A. The present invention also provides this advantage. What is also needed is a system allowing programmable width parallel transfer. The present invention provides this additional feature.

SUMMARY OF THE INVENTION

An apparatus and method are described for loading configuration information into a programmable integrated circuit configurable to perform parallel loading or bit serial loading within the same architecture. The programmable integrated circuit can be a field programmable gate array (FPGA). The configuration information is presented to the FPGA in data frames of N serial bits each. Several data frames are required to complete the configuration data for the FPGA of the present invention. Each data frame is divided into discrete serial portions having Y bits each (e.g., a data frame comprises N/Y data frame portions). In parallel mode, the data frame portions are loaded into a segmented configuration register of the FPGA, one portion per programming cycle, such that Y bits are loaded into the segmented configuration register on each programming cycle.

In an exemplary implementation Y=8 and N=400 such that 50 frame portions are required for each data frame. The segmented configuration register has Y separate serially coupled segments (e.g., shift register segments), each segment is N/Y bits in length. In parallel loading mode, a new data frame portion is received into an input register of Y bits on each programming clock cycle. All Y bits from this data frame portion are simultaneously loaded into respective segments of the configuration register (at the first bit position for each segment) such that each segment receives one bit per programming cycle. The bits of the configuration register are then shifted down by one and a new data frame portion of Y bits is received for the next programming cycle. Under this mechanism, Y bits are loaded in parallel into the configuration register for increased transfer rate of the configuration information. Since the received data frame is stored as consecutive bits in a single serial shift register, the architecture of the novel configuration register is also configurable into a serial loading mode. In this mode, the novel configuration register is configured to receive a single serial bit stream of the N bit data frame for downward compatibility. In either serial or parallel loading modes, after a data frame is received, it is copied into a memory column and a new data frame is received.

DETAILED DESCRIPTION OF THE DRAWINGS

Figure 2A:
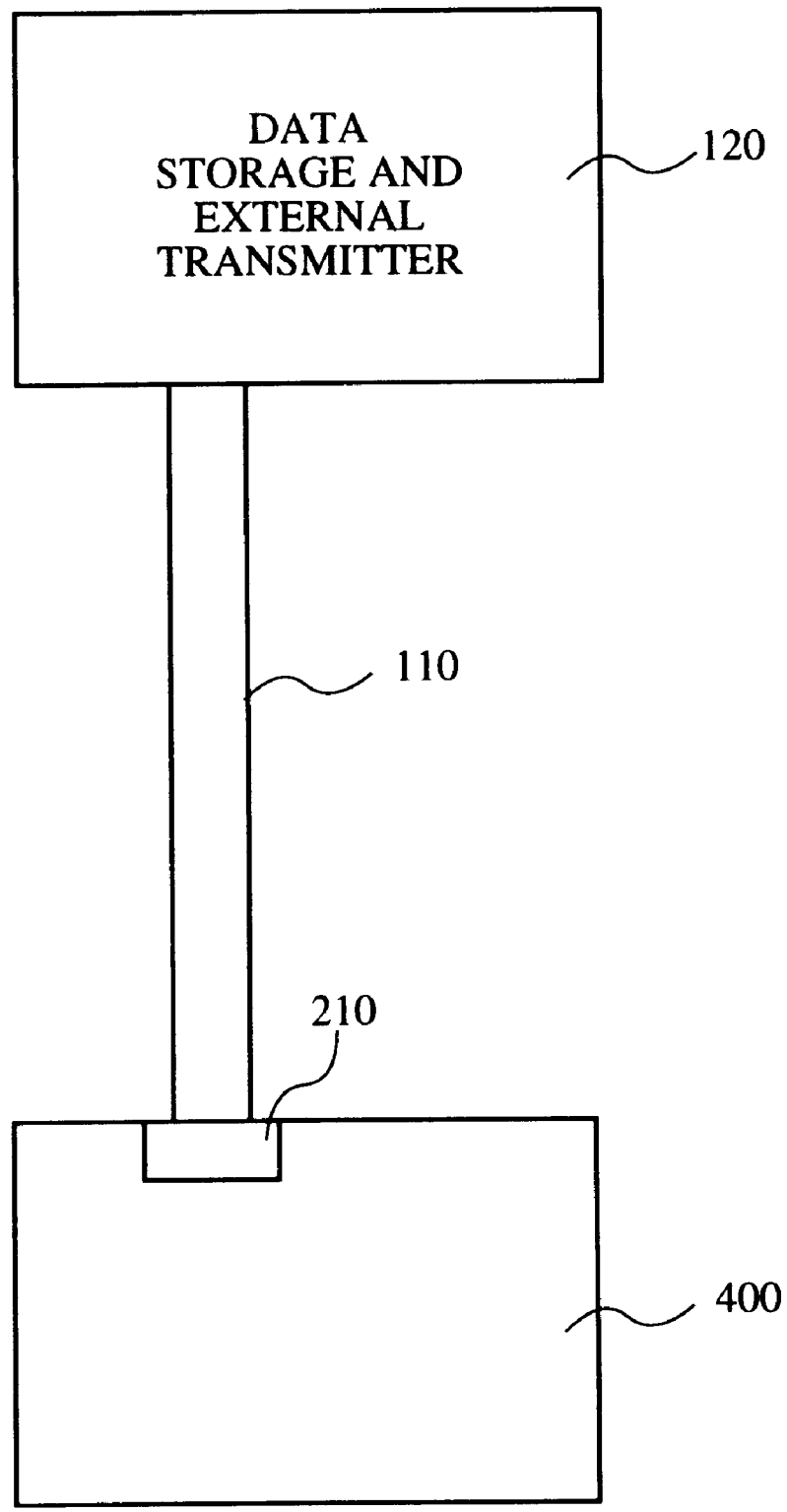
FIG. 2A is a block diagram illustrating the programmable integrated circuit of the present invention coupled to a transmitter circuit for transmitting configuration information.

FIG. 2A illustrates a block diagram of a data storage and external transmitter unit ("transmitter") 120 coupled to a programmable integrated circuit (e.g., FPGA) 400 by Y-bit wide bus 110. The transmitter 120 contains a sequence of data frames (N bits per data frame) stored in a memory unit (e.g., Read Only Memory (ROM), PROM, EEPROM, EPROM, flash memory, Random Access Memory (RAM), disk storage, etc.). The sequence of data frames make up the configuration information used to program the FPGA 400. The transmitter 120 accesses a particular data frame and sequentially transmits this data frame as a series of data frame portions over the Y-bit wide bus 110. Each data frame portion is Y bits in length. therefore, N/Y data frame portions are transmitted for each data frame. In one embodiment, each data frame is 400 bits and Y=8. It is appreciated that Y can be larger or smaller within the scope of the present invention. In the above embodiment, the bus 110 is 8 bits wide and for each programming cycle, bus 110 transfers a byte of configuration information into an input port 210 of the FPGA 400.

Figure 2B:
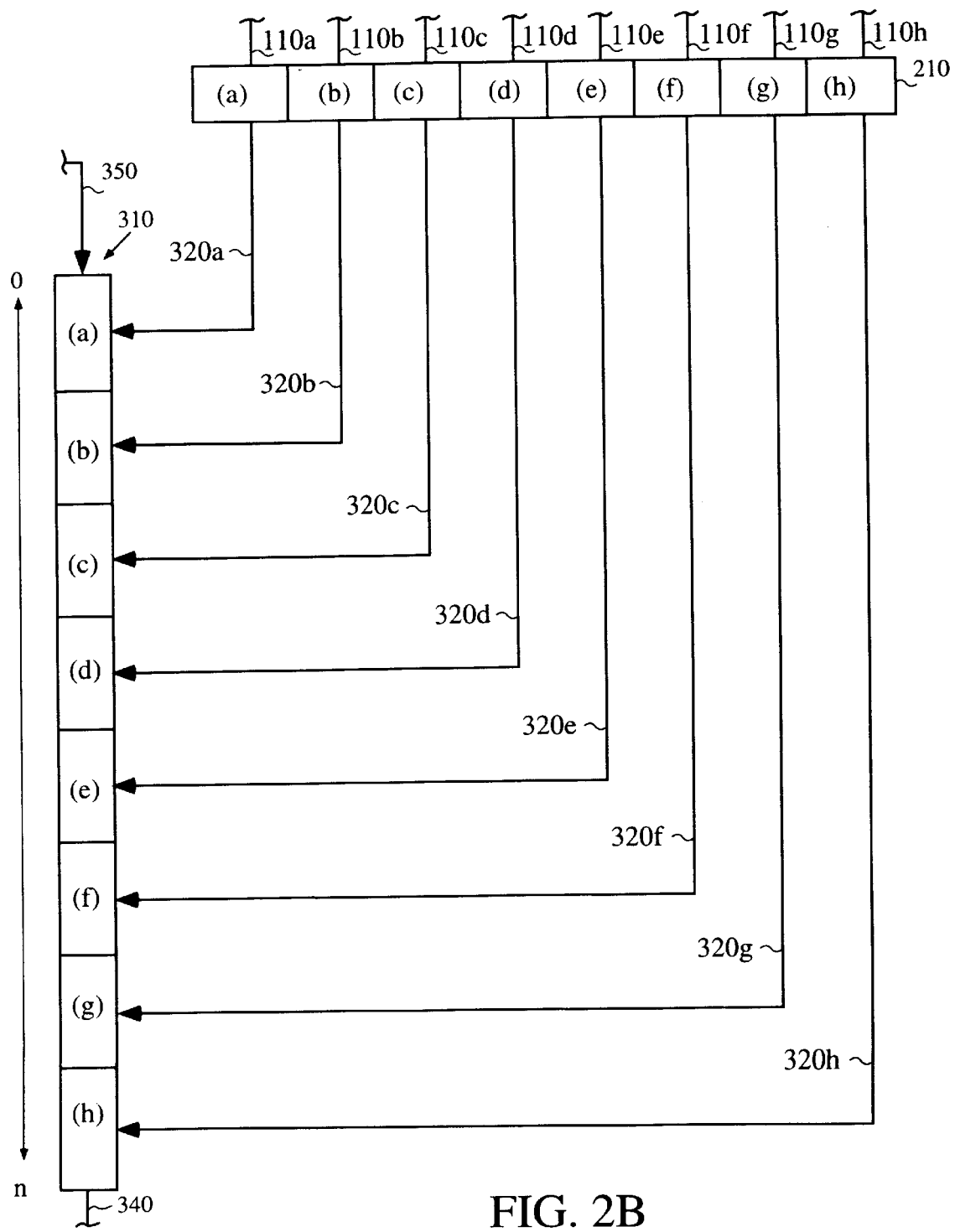
FIG. 2B is an illustration of the segmented configuration register of the present invention showing the many segments of the configuration register and the frame portions to which they correspond.

With reference to FIG. 2B, a segmented configuration register 310 in accordance with the present invention is shown. The segmented configuration register 310 (also referred to as "configuration register 310") is configurable to receive configuration information from the input port 210 in two different load modes.

In parallel load mode, for each programming cycle, each segment of Y segments of configuration register 310 receives one bit from Y bits of configuration information from input port 210 via Y output lines 320a–320h. In this mode, Y bits from input port 210 are transferred in parallel to the configuration register 310 during a single programming cycle where Y is at least two.

In serial load mode, configuration register 310 receives the configuration information in series, one bit per programming cycle (e.g., clock), via serial input port 350 in lieu of input register 210. The selection of parallel or serial load mode is configurable within the architecture of the configuration register 310 of the present invention and is designer-selectable.

More specifically, as shown in FIG. 2B, the configuration register 310 of the present invention is segmented into Y segments 310a–310h. The input port (e.g., register) 210 also supplies information over Y lines 320a–320h. In the example shown in FIG. 2B, Y=8, although the present invention can be practiced with larger or smaller values of Y and 8 is used for illustration only.

For a data frame having N (or n) bits, and a data frame portion having Y bits, each segment of segmented configuration register 310 contains N/Y single bit registers (e.g., flip-flops). In one implementation, each segment of the configuration register 310 is 50 bits in length.

Input port 210 contains Y individual register cells 210a–210h. Each register cell is coupled to a respective input line 110a–110h of the Y lines of bus 110 (FIG. 2A). The individual register cells 210a–210h receive the Y bits (in this example, a byte) of a data frame portion as each data frame portion is transmitted over bus 110.

As shown in FIG. 2B, the first bit position of each segment of the eight segments 310a–310h of configuration register 310 is coupled to an associated respective cell of the eight cells 210a–210h of input port 210. Eight data output lines 320a–320h are used to provide this coupling and supply the Y bits of each data frame portion to the segmented configuration register 310 during parallel load mode. Specifically, line 320a is coupled to supply a bit from register cell 210a to a first bit position of respective segment 310a, line 320b is coupled to supply a bit from register cell 210b to respective segment 310b, line 320c is coupled to supply a bit from register cell 210c to respective segment 310c, line 320d is coupled to supply a bit from register cell 210d to respective segment 310d, line 320e is coupled to supply a bit from register cell 210e to respective segment 310e, line 320f is coupled to supply bits from register cell 210f to respective segment 310f, line 320g is coupled to supply a bit from register cell 210g to respective segment 310g, and line 320h is coupled to supply a bit from register cell 210h to respective segment 310h. Using the above architecture, in parallel load mode, a bit from each register cell 210a–210h is transferred simultaneously to the first bit position of its corresponding respective segment of segments 310a–310h.

With reference to the orientation of FIG. 2B, segments located below other segments are said to be "downstream" segments which is based on the typical bit movement through the register 310 in either serial load or parallel load modes. Segments which are above other segments are said to be "upstream" segments.

Serial Load. The shift output of each segment of segments 310a–310g is individually coupled to the input of its downstream segment (e.g., 310b–310h) for serial data transfer through the configuration register 310. During each clock cycle in serial load mode, serial configuration data from bus 110 is loaded over line 350, one bit per cycle, into configuration register 310 in accordance with the mechanism of FIG. 1A. After each bit is loaded into the first bit position of segment 310a, all bits within segmented configuration register 310 are shifted down stream by one bit position.

Parallel Load. During a clock cycle of a parallel load mode, each of the data output lines 320a–320h of FIG. 2B receives a bit from its corresponding respective register cell of 210a–210h. For instance, register cell 210a outputs over line 320a, register cell 210b outputs over line 320b, register cell 210c outputs over line 320c, register cell 210d outputs over line 320d, register cell 210e outputs over line 320e, register cell 210f outputs over line 320f, register cell 210g outputs over line 320g, and register cell 210h outputs over line 320h. Accordingly, during a parallel transfer, Y bits are loaded into the segmented configuration register 310 per programming clock cycle. In the example of FIG. 2B, eight bits are loaded into segmented configuration register 310 per programming clock cycle.

With reference to FIG. 2B, whether in serial load mode or parallel load mode, with each programming clock cycle, the bits within configuration register 310 of the present invention are each shifted downstream by one bit. When in parallel load mode, after each programming clock cycle, a new Y-bit data frame portion is loaded into input port 210.

Data can also be serially shifted out of configuration register 310 via output line 340 which is coupled to the last bit position of segment 310h. In one embodiment, line 320a is used as the serial input line, thus eliminating line 350.

It is appreciated that the value N/Y is not required to be an integer. For instance if N=403, then Y=8 is allowed. In this case, single extra bits can be distributed to segments (extra shift register cells) or multiple extra bits can be added to the last segment. Some segments are shorter, so the leading bits drop off the end and are ignored by the configuration of FIG. 2B.

Figure 3:
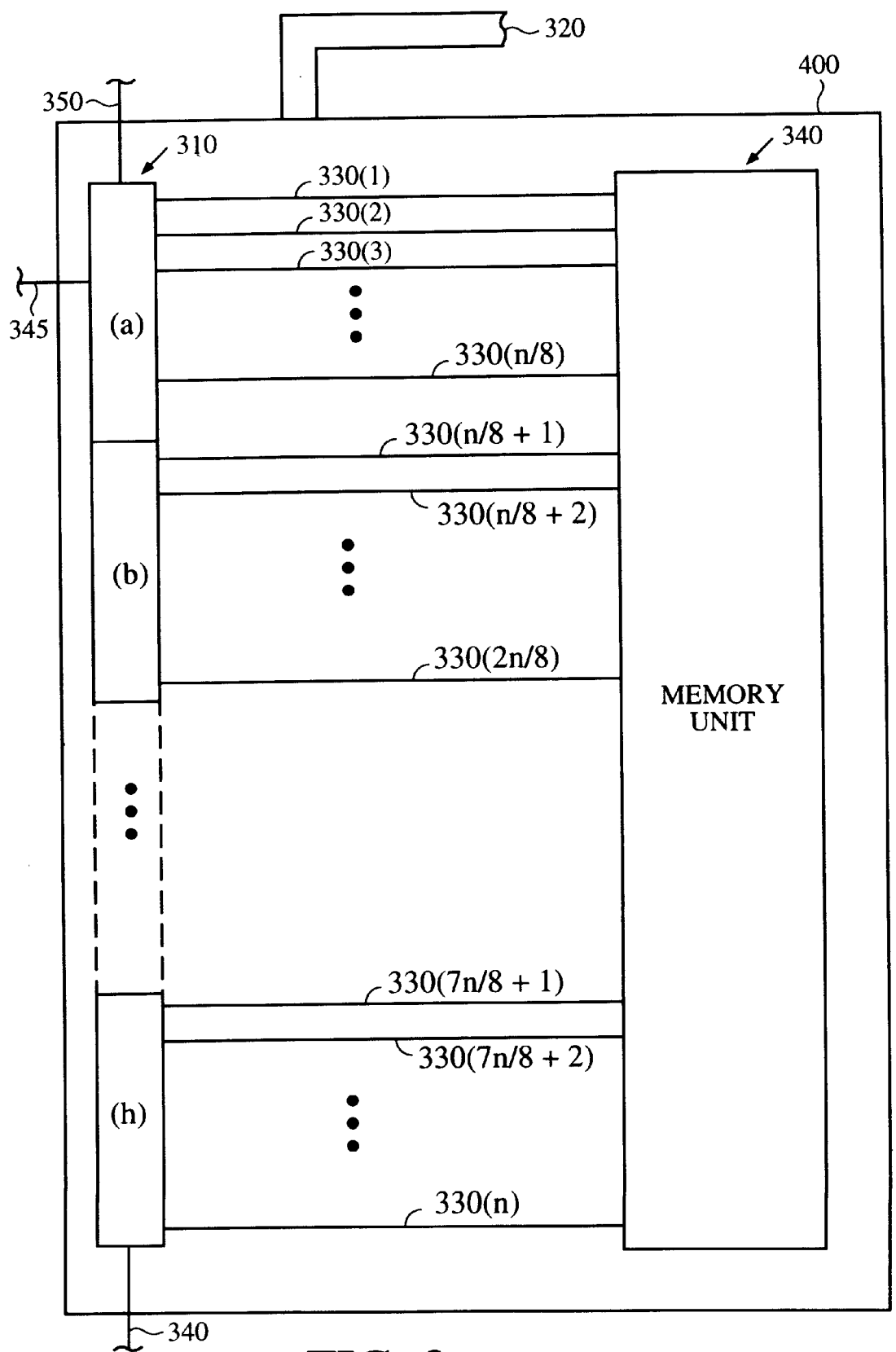
FIG. 3 illustrates the segmented configuration register of the present invention within the novel FPGA.

FIG. 3 illustrates a programmable integrated circuit 400 (e.g. an FPGA) in accordance with the present invention. In addition to other well known elements, the FPGA 400 of the present invention includes a memory unit 340 and the segmented configuration register 310. Each bit of each segment of segments 310a–310h is coupled to a separate data line 330(1 to n). Therefore, each segment of segments 310a–310h is coupled to N/Y data lines (e.g., where Y=8 in one implementation). Since the segments 310a–310h are vertically oriented, the data lines 320(1 to n) are not staggered. The data lines 330(1 to n) are each coupled to memory unit 340 so that a word (or words) of data from the configuration register 310 can be stored in memory unit 340 using a single memory write cycle. Configuration data transfer bus 320 is also shown in FIG. 3 and contains lines 320a–320h (FIG. 2B).

FIG. 3 also illustrates a mode selection input line 345. Mode selection input line 345 carries a bit that determines the operational load mode of configuration register 310 of the present invention. Mode selection input line 345 indicates if configuration register 310 is to operate in the serial load mode or parallel load mode. This selection is designer-selectable.

In serial load mode, the present invention requires at least N programming clock cycles to load configuration register 310 with a frame of data having N bits. In parallel load mode, the present invention requires at least N/Y programming clock cycles to load configuration register 310 with the same frame of data, where Y is the number of segments in configuration register 310. In the example of FIG. 3, Y=8.

When configuration register 310 is full with a frame of configuration data (e.g., N bits), by either a parallel or serial load operation, the frame of data is transferred as a word (or words) of N bits to memory unit 340. A number of well known addressing and memory write mechanisms and methods can be used by the present invention to perform the memory write function. The first bit of the frame of data indicates a frame full flag which is used by the present invention to initiate the above referenced memory write function.

Figure 4A:
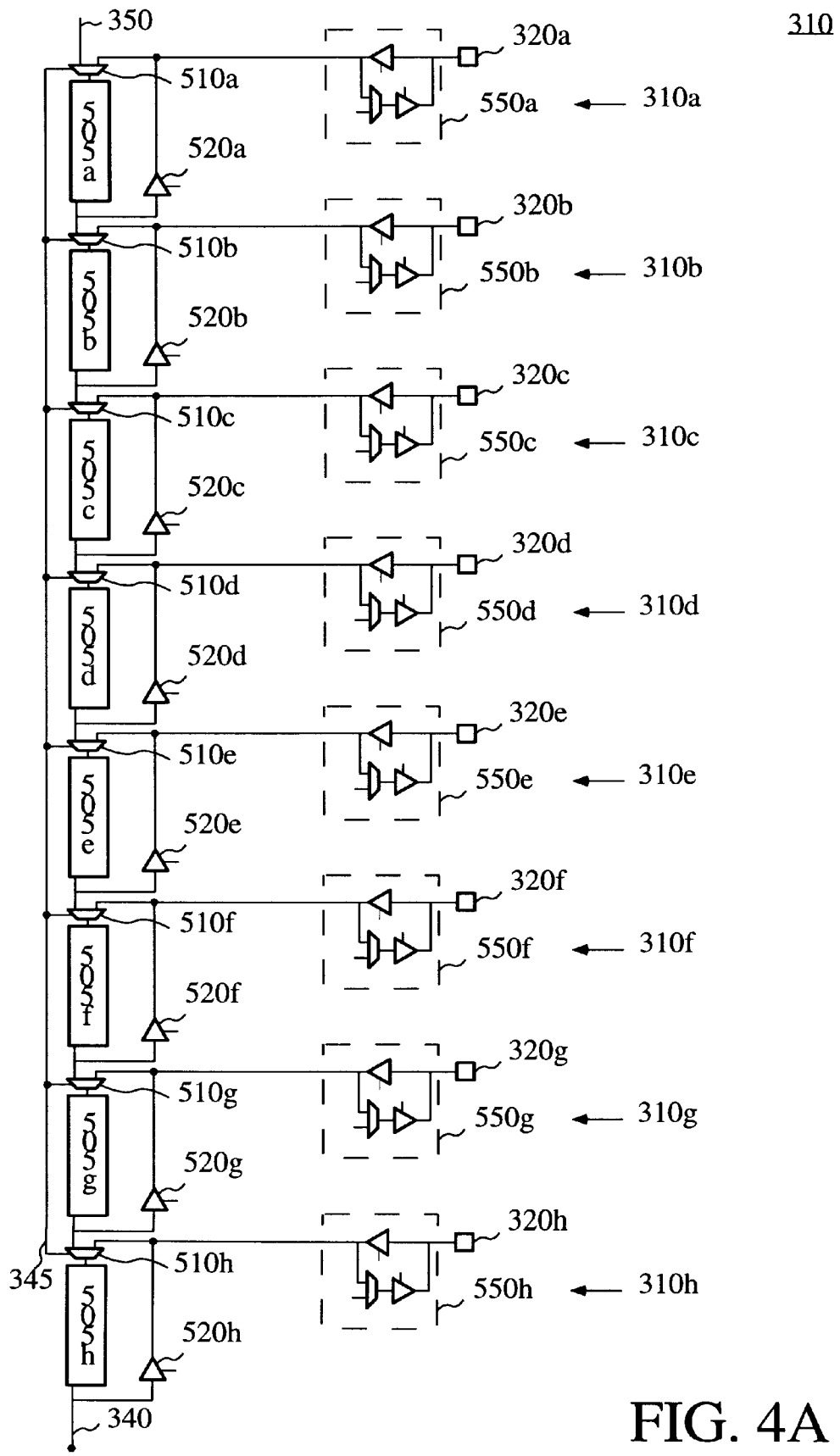
FIG. 4A is a schematic diagram of the segments of the configurable segmented configuration register of the present invention.

FIG. 4A illustrates the segmented configuration register 310 of the present invention in more detail. The segments 310a–310h each contains a serial shift register 505a–505h of X bits each where X is equal to N/Y. The shift registers 505a–505h can be realized using serially coupled D flip-flop cells as is well known in the art. N is the number of bits per each data frame and Y is the number of segments in configuration register 310. Assuming, for example, N is 400 and Y is eight, each shift register of 505a–505h contains 50 bits, in one implementation. Of course, the present invention can be practiced with implementations having larger or smaller values of N and Y yielding different values of X. Although not shown in FIG. 4A, the data lines 330(1 to n) (FIG. 3) are coupled to shift registers 505a–505h.

Adjacent segments of configuration register 310 are connected to each other via multiplexers (e.g., multiplexers 510b–510h) which can also receive input from the data lines 320a–320h. Depending on the selected load mode (e.g., parallel or serial), multiplexers 510a–510h each can accept an input from either the shift register of its associated upstream segment or from a data output line of lines 320a–320h, through circuits 550a–550h. For instance, multiplexer 510b receives inputs from shift register 505a or from data output line 320b, via circuit 550b. If the serial load mode is selected, then data is selected from the shift register of the upstream segment, whereas if parallel data transfer mode is selected, then data is input from a data output line 320a–320h.

The mode selection input line 345 of FIG. 4A is coupled to the select lines of each of the multiplexers 510a–510h to control each simultaneously. It is appreciated that all of the shift registers 505a–505h of configuration register 310 are clocked to a common clock signal that is synchronous with the rate of data frame portions transferred from bus 110.

In serial load mode, the multiplexers 510a–510h each select input from the upstream segment and segment 510a accepts input from line 350. In this mode, the configuration register 310 acts as a single serial shift register. On each programming clock cycle, a new bit is shifted into segment 310a over line 350 and all bits in the configuration register 310 are serially shifted downstream by one bit position. In parallel load mode, the multiplexers 510a–510h individually select input from the output data lines 320a–320h, respectively. On each programming clock cycle, segments 310a–310h each receive a new bit and all bits in the configuration register 310 are serially shifted downstream by one bit position.

An additional advantage of the present invention is that the circuit arrangement of FIG. 4A supports breaking the N-bit frame into several different sizes by turning on some of the multiplexers 510 to receive data over lines 320. After each programming cycle, the received bits are shifted downstream by one bit, and during this procedure some multiplexers 510 select from the upstream segment while others introduce data in parallel. For instance, the present invention configuration of FIG. 4A offers an 8 bit parallel load mode by turning on multiplexers 510a–510h, while a 4 bit parallel load mode is realized by only turning on multiplexers 510a, 510c, 510e and 510g to accept data over lines 320a, 320c, 320e and 320g, while a 2 bit parallel load mode is realized by only turning on multiplexers 510a and 510e to accept data over lines 320a and 320e.

Figure 4B:
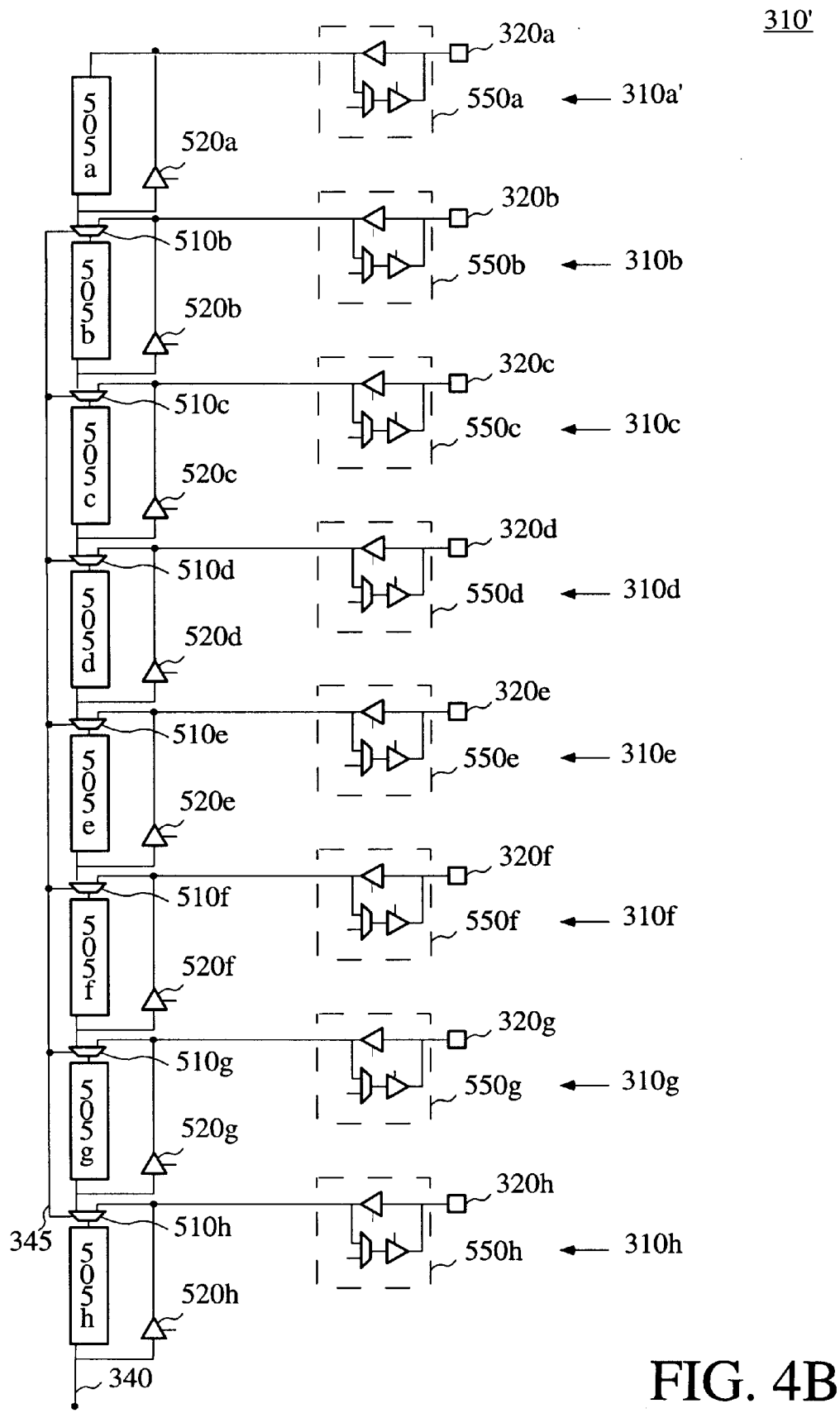
FIG. 4B is a schematic diagram of the segments of another configurable segmented configuration register of the present invention.

Note that certain features of segmented configuration register 310 can be modified while maintaining basic functionality. For example, FIG. 4B illustrates a segmented configuration register 310' in which multiplexer 510a of segment 310a (FIG. 4A) is eliminated. Thus, in this embodiment, segment 310a' includes a shared parallel and serial input line. Other modifications to the segmented configuration register will be apparent to those skilled in the art and are considered part of the present invention.

Figure 5:
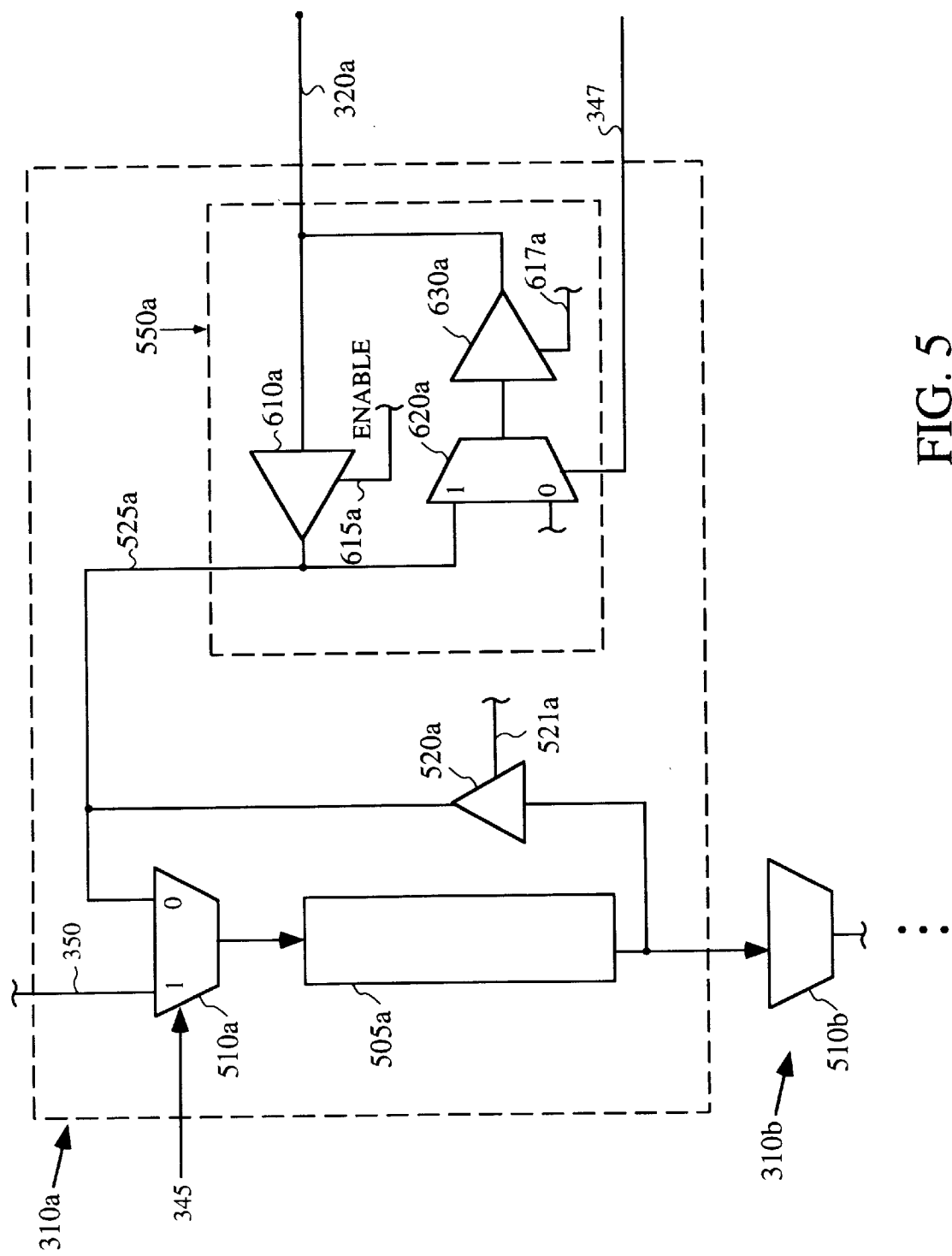
FIG. 5 is a schematic diagram of a segment of the segmented configuration register of the present invention.

FIG. 5 illustrates the circuitry of segment 310a in more detail. Segments 310b–310h of configuration register 310 each contain analogous circuitry to that of segment 310a. The select input of multiplexer 510a is controlled by the mode selection signal carried over line 345. When select input line 345 carries a "1," serial load mode is selected and when select input line 345 carries a "0," parallel load mode is selected. It is appreciated that the above logical designations can be reversed in accordance with present invention.

Multiplexer 510a receives two inputs. For segments 310b–310h, a first input (e.g., logical "1") is received from the shift register of the upstream segment. For segment 310a, this input is received from line 350 since there is no upstream segment. The second input of multiplexer 510a (e.g., logical "0") is received from line 525a which is coupled to the output of buffer 610a and coupled an input of multiplexer 620a of the input/output circuit 550a. The output of multiplexer 510a is coupled to the input of shift register 505a. The output of shift register 505a is coupled to an input of the multiplexer 510b of the downstream segment 310b. The output of shift register 505a is also coupled to buffer 520a which is coupled to line 525a.

Within the input/output circuit 550a of FIG. 5, line 320a is coupled to the input of buffer 610a and is also coupled to the output of buffer 630a. The input of buffer 630a is coupled to the output of multiplexer 620a. Line 615a is an enable line for buffer 610a. Line 347 is coupled to the selection input of multiplexer 620a.

Input/output driver circuit 550a allows data over line 320a to be shifted into the input of shift register 505a via multiplexer 510a (e.g., in data-in mode) and also allows data from the output of shift register 505a to be shifted out over line 320a via buffer 520a (e.g., in data-out mode). Enable line 521a tristates buffer 520a when deasserted. When shifting data in from line 320a to shift register 505a, the enable line 615a is asserted and enable line 617a for buffer 630a is deasserted causing the output of buffer 630a to be tristated. Also, enable line 521a is deasserted. When shifting data out from shift register 505a over line 320a, the enable line 615a is deasserted causing the output of buffer 610a to be tristated and enable line 521a is asserted. Also, the enable line 617a for buffer 630a is asserted, and line 347 carries a logical "1," thereby causing multiplexer 620a to select the logical "1" input, e.g., the output of buffer 520a, to be driven over line 320a.

When receiving configuration data in parallel mode, circuit 505a allows data received over line 320a to be shifted into shift register 505a through multiplexer 510a. In an alternative configuration, circuits 550a–550h allow data from the shift registers 505a–505h to be driven over lines 320a–320h for parallel data transfer from the configuration register 310 of the present invention to an outside receiver. Table I below illustrates a configuration truth table for the present invention configuration register 310.

TABLE I

| Mode Selected Line 345 | Buffer 610a | Buffer 630a | Buffer 520a |
|---|---|---|---|
| Serial Data In Serial Mode | N/A | N/A | N/A |
| Serial Data Out Serial Mode | N/A | N/A | N/A |
| Parallel Data In Parallel Mode | Enable | Disable | Disable |
| Parallel Data Out Parallel Mode | Disable | Enable* | Enable |

*Mux 620a selects logical "1"

Figure 1A:
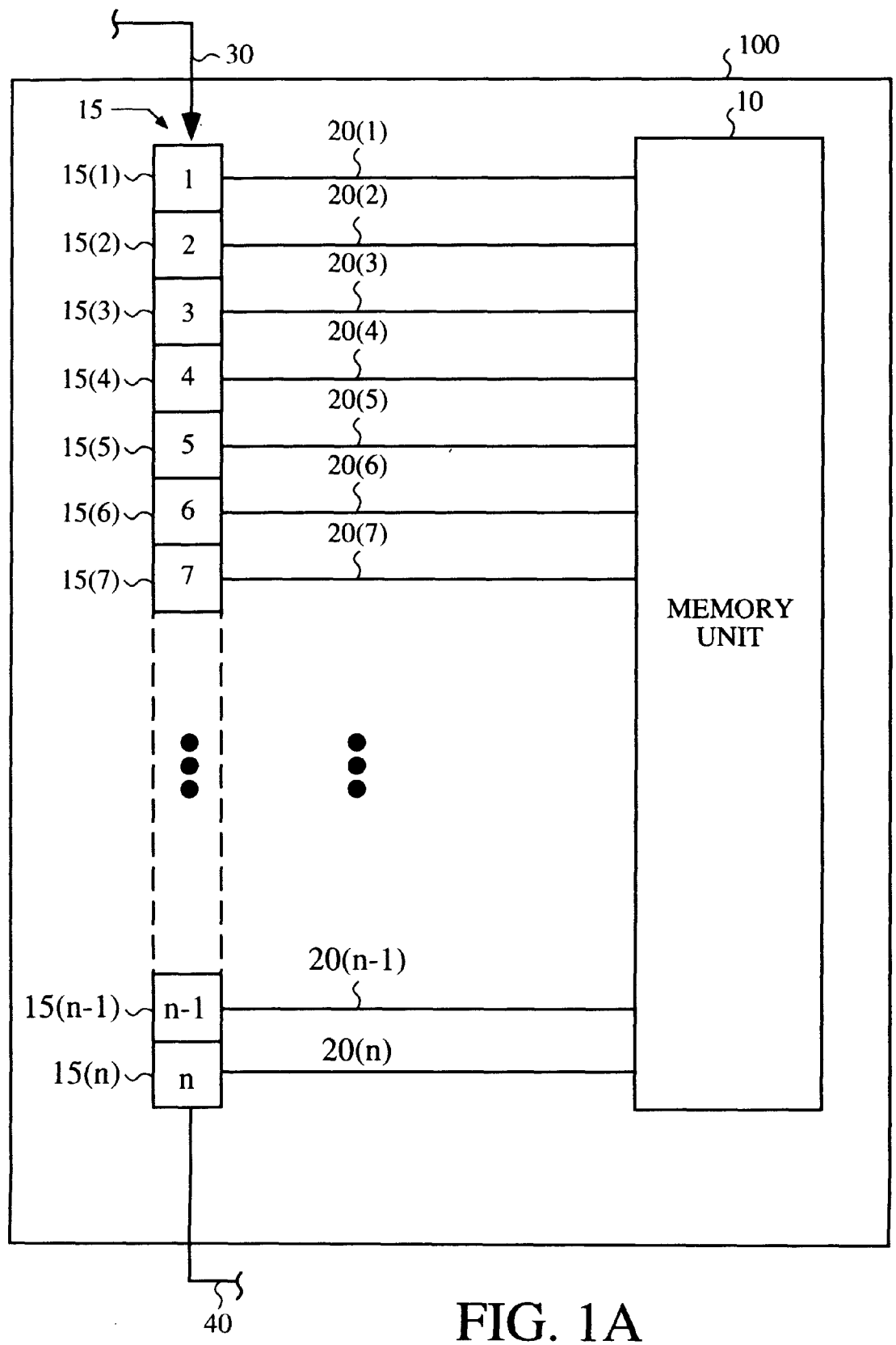
FIG. 1A is a prior art implementation of a single serial configuration register for loading configuration information.
Figure 1B:
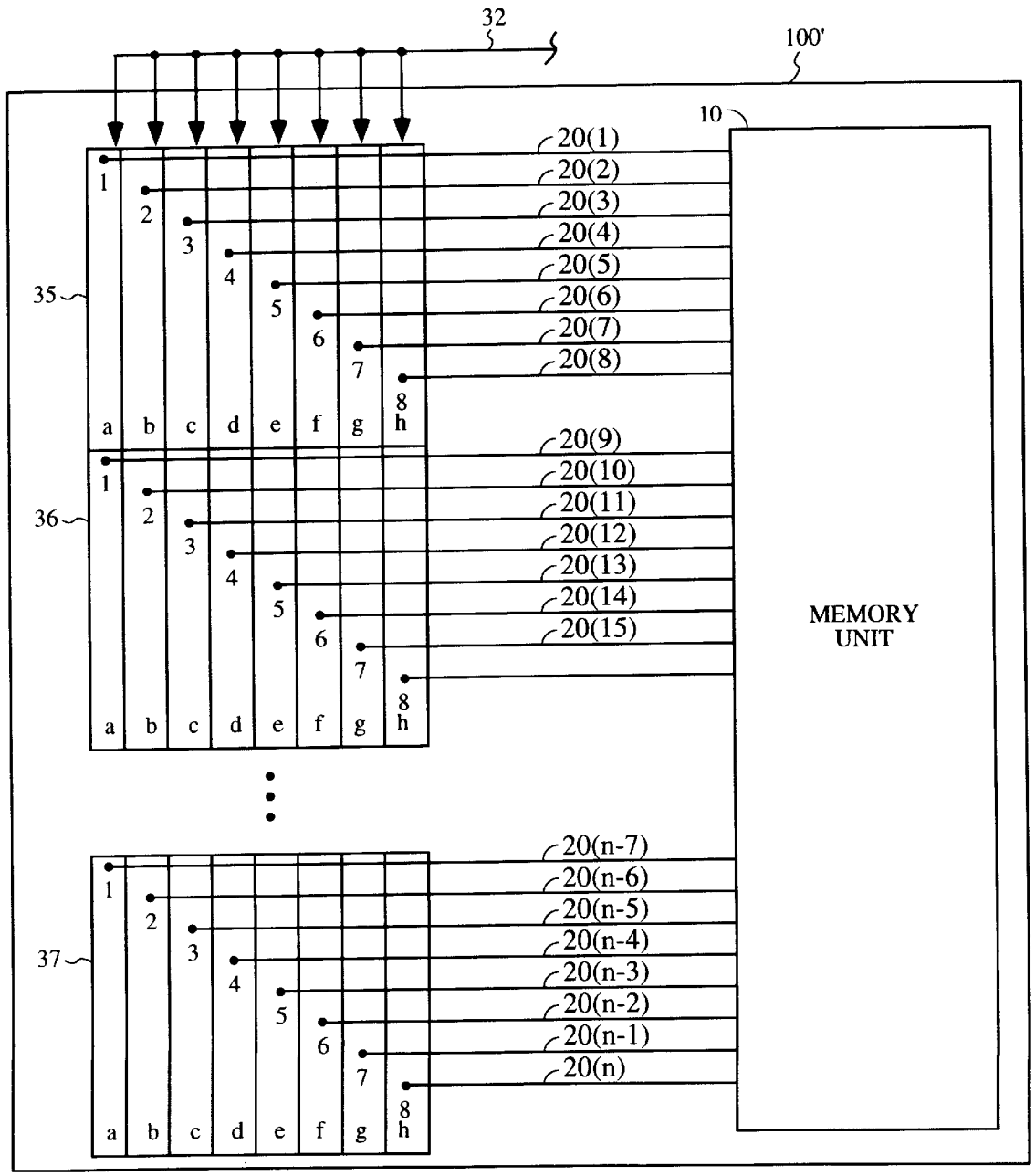
FIG. 1B is a prior art implementation of a configuration register where eight bits are loaded in parallel into staggered bit positions on each programming cycle and is not downward compatible with the design of FIG. 1A.

Due to the architecture of the configuration register 310 of the present invention, when mode selection line 345 is set to serial load mode, the present invention emulates the prior design of FIG. 1A. However, when parallel mode is selected, the present invention configuration register 310 advantageously allows parallel input of Y bits per clock cycle (in this example, Y=8). By allowing these features, the present invention offers high speed configuration information transfer rates while being downward compatible with systems of FIG. 1A.

Figure 6:
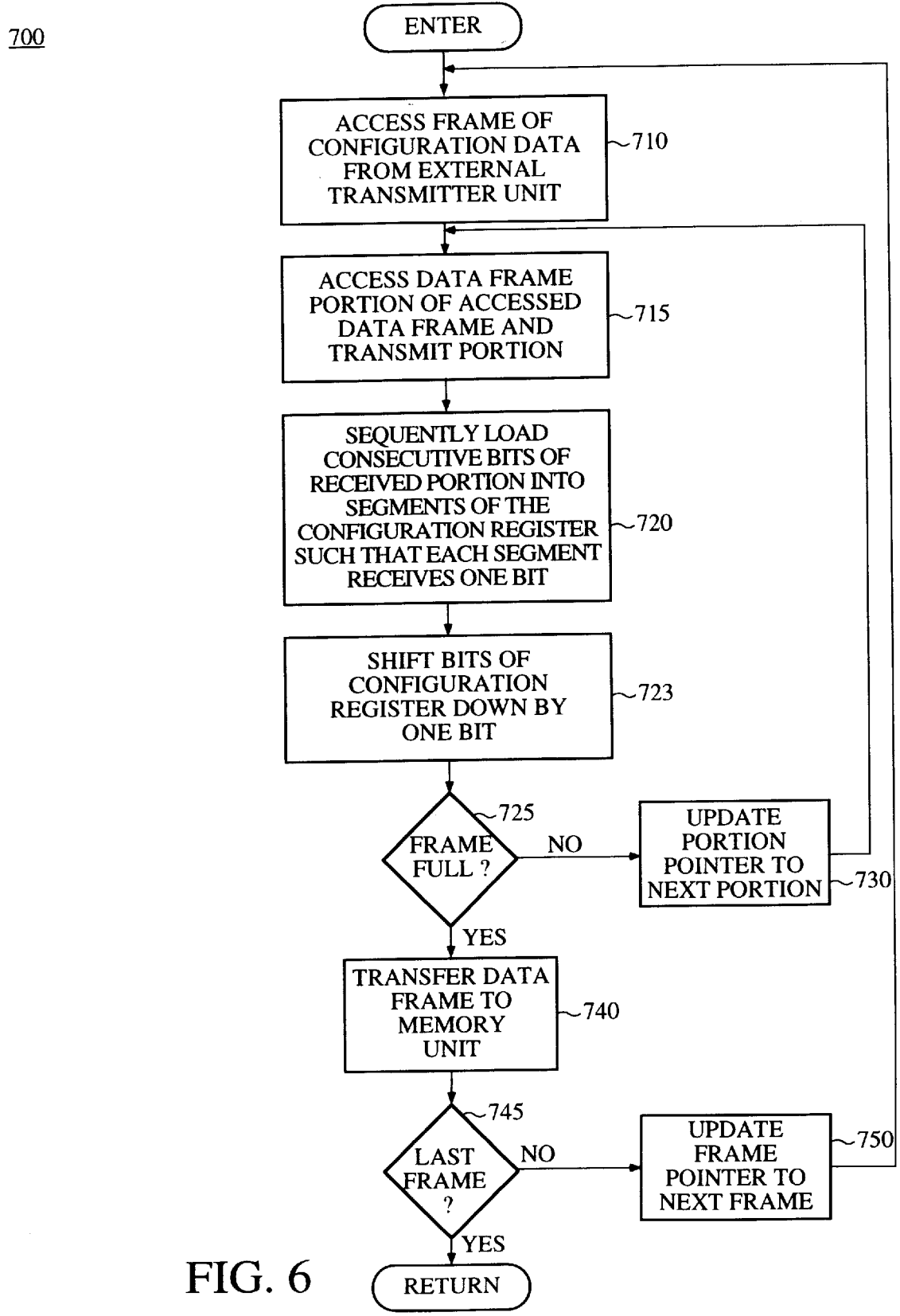
FIG. 6 is a flow diagram of a configuration information parallel loading operation with the present invention segmented configuration register.

FIG. 6 illustrates a flow diagram of the process 700 used by the present invention configuration register 310 during parallel load mode. At step 710, mode selection (e.g., line 345) is set to parallel load mode and the present invention accesses a first frame of configuration information (e.g., data) from the external transmitter unit 120 (FIG. 2A). The frame has N bits and Y data frame portions. In one implementation, Y=8.

At step 715 of FIG. 6, the external transmitter unit 120 selects the first data frame portion of the selected frame and transmits this selected portion over bus 110 to the input port 210. In one implementation, the transmitted portion is a byte, bus 110 is a byte wide, and the receiving port 210 receives the byte of data in eight register cells. The configuration register 310 of the present invention provides a segment for each bit within the register cells.

Within step 720, a programming cycle starts. The input port 210 is accessed such that when the current data frame portion is received, each register cell of the input port 210 supplies one bit over a separate respective output line of lines 320a–320h. The present invention sequentially transfers the bits stored in the register cells 210a–210h to their associated respective register segments 310a–310h such that each segment receives one bit. At step 720, Y bits are simultaneously transferred into the configuration register 310 during the programming cycle. At step 723, after the transfer, each bit within the segmented configuration register 310 is shifted downstream by one bit.

At step 725, the present invention checks if the configuration register 310 is full, e.g., the presence of a frame full flag within the last bit position of the most downstream segment. If the current data frame is fully loaded into the configuration register 310, processing flows to step 740. If not, then the next data frame portion is to be transferred as indicated by step 730 where a data frame portion pointer is updated. Flow continues to step 715 where the next data frame portion is received and a new programming cycle commences. At step 725, if the data frame is fully loaded into the configuration register 310, then at step 740, the present invention transfers the frame of data stored in the configuration register 310 over the data lines 330(1 to n) and into the memory unit 340. A number of well known memory write operations can be performed at step 740.

At step 745, the present invention checks if the transferred data frame is the last data frame of configuration information for the FPGA. If not, then at step 750, a data frame pointer is updated and new data frame is accessed having N bits and Y portions and processing returns to step 720. At step 745, if the last data frame is processed then process 700 exits.

It is appreciated that in order for the configuration data to be loaded in the proper order within the configuration register 310 in accordance with the present invention parallel load mode, the configuration data as stored in the external transmitter unit 120 is first properly sorted when stored. By loading each of Y bits into different segments during parallel loading, the present invention causes the data received over bus 110, during any particular programming cycle, to be stored within a particular order within configuration register 310. In other words, the data within the data frame portion is spread out over the Y segments of the configuration register 310.

The ordering procedure required to pre-order the configuration data within external transmitter 120 such that the proper order is realized within memory unit 340 is readily obtainable by one skilled in the art given the discussion of the present invention herein. The below pseudo code procedure can be used to perform the pre-ordering of the configuration data before storage into the external transmitter unit 120:

Pre-order pseudo code:
```
access df[1 to N], Y;
u=1;
for z=1 to [N/Y] do
    for i=0 to Y-1 do
        odf[u]=df[i*[N/Y]+z]
        u=u+1
    next i
next z
```
Where, df[1 to N] is the pre-ordered data frame,
Y is the frame portion size
odf[1 to N] is the ordered data frame for storage into transmitter unit 120

The present invention, a segmented configuration register allowing parallel loading of configuration data for an FPGA while being downward compatible with single serial shift register mechanisms, is thus described. While the present invention has been described in particular embodiments, it should be appreciated that the present invention should not be construed as limited by such embodiments, but rather construed according to the below claims.

We claim:

1. In a field programmable integrated circuit, a circuit for receiving data, said circuit comprising:

an input port having Y lines, each line supplying a bit from a data frame having a plurality of bits; and a segmented configuration register for receiving said plurality of bits, said segmented configuration register comprising Y segments, each segment coupled to one of said Y lines, wherein said segmented configuration register includes a first segment and at least one following segment, wherein said first segment comprises:
an input line; and
a first multi-bit serial shift register coupled to said input line, wherein each following segment comprises:
a multiplexer for selecting one of an output line from an upstream segment and a line of said Y lines; and
another multi-bit serial shift register coupled to an output line of said multiplexer, wherein said segmented configuration register is operable between a serial load mode and a parallel load mode.

2. The circuit of claim 1, wherein at least one segment includes another multiplexer for selecting one of said output line from an upstream segment and a source line.

3. A circuit as described in claim 1 further comprising:

a plurality of mode selection lines coupled to the multiplexers for selecting between said parallel load mode and said serial load mode, wherein in said serial load mode each multiplexer selects said output line, and wherein in said parallel load mode each multiplexer selects said line of Y lines.

4. A circuit as described in claim 1 wherein each multi-bit serial shift register comprises:

a plurality of single bit registers;

a plurality of data lines, wherein each register of said multi-bit shift registers of said Y segments is coupled to a respective data line; and a memory unit, wherein said plurality of data lines are coupled to said memory unit.

* * * * *